US012677621B2

(12) United States Patent
Sumi

(10) Patent No.: US 12,677,621 B2
(45) Date of Patent: Jul. 7, 2026

(54) REPLACEMENT END TIME DETERMINATION METHOD, SUBSTRATE PROCESSING METHOD AND SUBSTRATE PROCESSING APPARATUS

(71) Applicant: SCREEN Holdings Co., Ltd., Kyoto (JP)

(72) Inventor: Noritake Sumi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 500 days.

(21) Appl. No.: 18/263,027

(22) PCT Filed: Jan. 5, 2022

(86) PCT No.: PCT/JP2022/000094
§ 371 (c)(1),
(2) Date: Jul. 26, 2023

(87) PCT Pub. No.: WO2022/163313
PCT Pub. Date: Aug. 4, 2022

(65) Prior Publication Data
US 2024/0105442 A1     Mar. 28, 2024

(30) Foreign Application Priority Data

Jan. 28, 2021    (JP) ................................. 2021-011986

(51) Int. Cl.
*H10P 70/00*          (2026.01)
*H10P 72/00*          (2026.01)
*H10P 74/00*          (2026.01)
(52) U.S. Cl.
CPC .......... *H10P 70/80* (2026.01); *H10P 72/0408* (2026.01); *H10P 74/238* (2026.01)
(58) Field of Classification Search
CPC .... H10P 70/80; H10P 72/0408; H10P 74/238; H10P 52/00; F26B 5/00; F26B 5/005
See application file for complete search history.

(56) References Cited

U.S. PATENT DOCUMENTS 6,802,961 B2    10/2004 Jackson ......................... 210/86
10,695,804 B2    6/2020 Mostovoy et al.
(Continued)

FOREIGN PATENT DOCUMENTS

CN          101193694 A      6/2008
CN          108022861 A      5/2018
(Continued)

OTHER PUBLICATIONS

International Search Report mailed Mar. 15, 2022 in corresponding PCT International Application No. PCT/JP2022/000094.
(Continued)

*Primary Examiner* — Thomas M Hammond, III
(74) *Attorney, Agent, or Firm* — OSTROLENK FABER LLP

(57)          ABSTRACT

This invention relates to a replacement end time determination method in a process of replacing a liquid to be replaced by a processing fluid in a supercritical state and a substrate. In the invention, a density profile is obtained at each of a dry state where the liquid to be replaced is not present in a chamber and a wet state where the liquid to be replaced is present in the chamber by supplying and discharging the processing fluid into and from the chamber in accordance with a predetermined supply/discharge recipe while maintaining the processing fluid in a supercritical state. When both densities become substantially equal to each other after the density at the wet state becomes larger than the density at the dry state, the replacement of the liquid to be replaced by the processing liquid is regarded to be finished.

14 Claims, 5 Drawing Sheets

(56)  References Cited

U.S. PATENT DOCUMENTS

| | | | |
|---|---|---|---|
| 2006/0280027 A1 | 12/2006 | Fulton ........................... 366/101 |
| 2011/0240066 A1 | 10/2011 | Kamikawa ...................... 134/26 |
| 2012/0240426 A1* | 9/2012 | Hayashi ................. H10P 70/80 |
| | | | 34/351 |
| 2012/0247516 A1 | 10/2012 | Sato et al. ...................... 134/26 |
| 2018/0130675 A1 | 5/2018 | Goshi et al. |
| 2018/0138058 A1 | 5/2018 | Egashira et al. |
| 2019/0224723 A1 | 7/2019 | Mostovoy et al. |
| 2020/0020550 A1 | 1/2020 | Goshi et al. |

FOREIGN PATENT DOCUMENTS

| | | | | | |
|---|---|---|---|---|---|
| CN | 111540694 A | * | 8/2020 | ............. H10P 72/06 |
| JP | 2004-207579 A | | 7/2004 | |
| JP | 2007-152195 A | | 6/2007 | |
| JP | 2012-243776 A | | 12/2012 | |
| JP | 2018-081966 A | | 5/2018 | |
| KR | 20220031500 A | * | 3/2022 | ............. F26B 21/30 |
| TW | 201218296 A | | 5/2012 | |
| TW | 201241895 A1 | | 10/2012 | |
| WO | WO 2018/173861 A1 | | 9/2018 | |

OTHER PUBLICATIONS

Taiwanese Office Action dated Sep. 21, 2023, issued in corresponding Taiwanese Patent Application No. 111102837.

Office Action dated Mar. 18, 2026 issued in corresponding Chinese Patent Application No. 202280010942.0 and its English translation.

* cited by examiner

F I G. 2
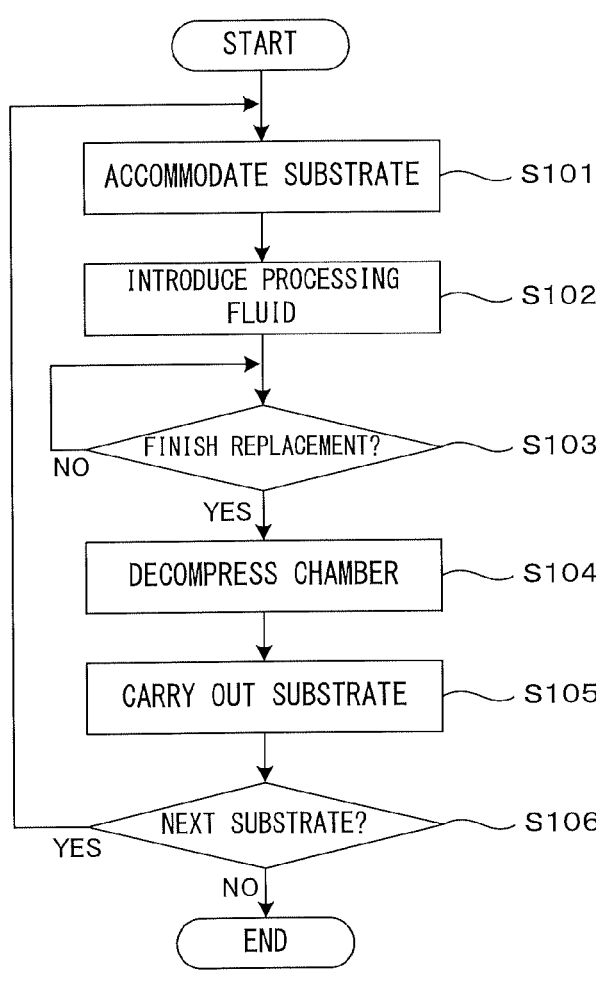

F I G.  3
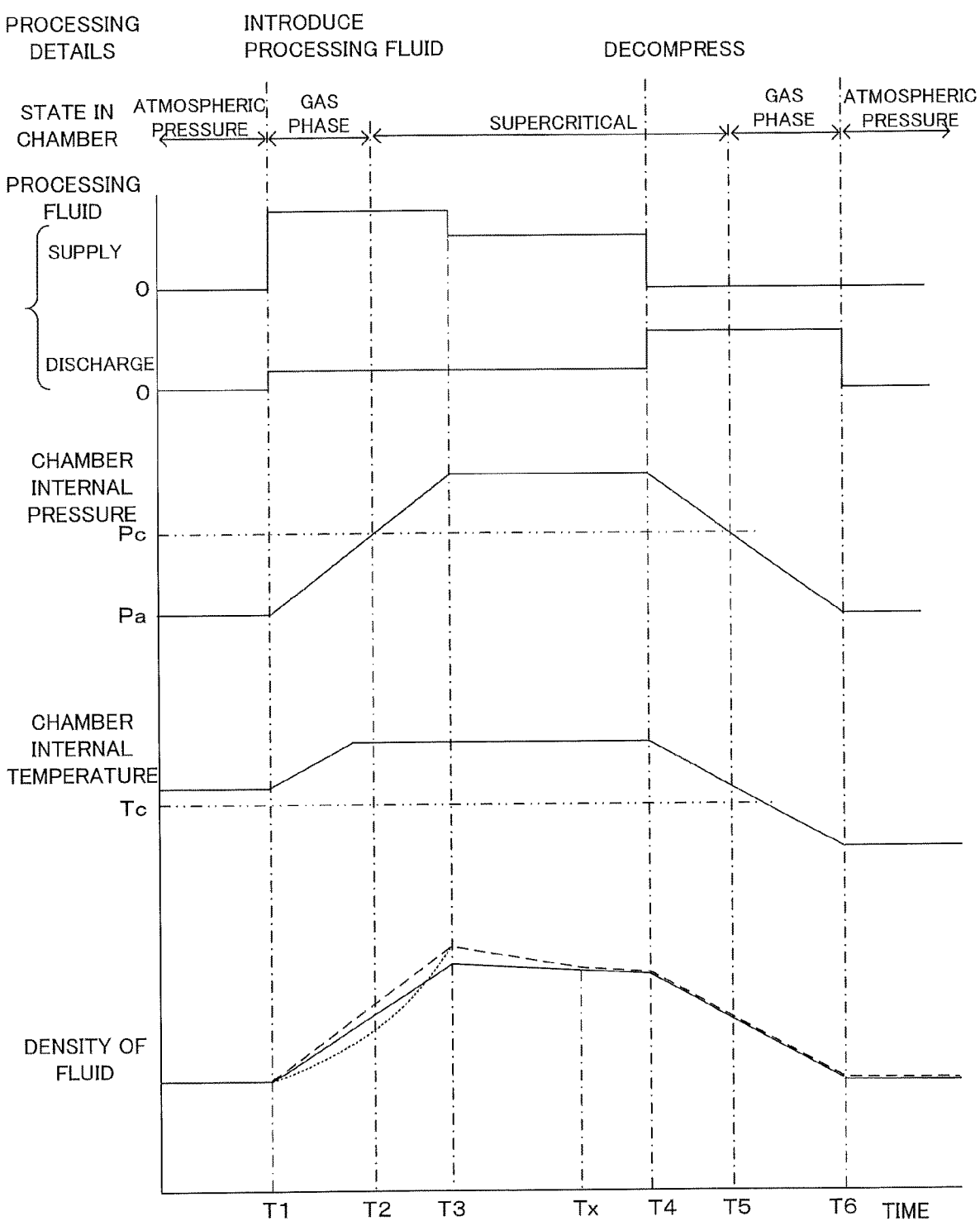

F I G. 5
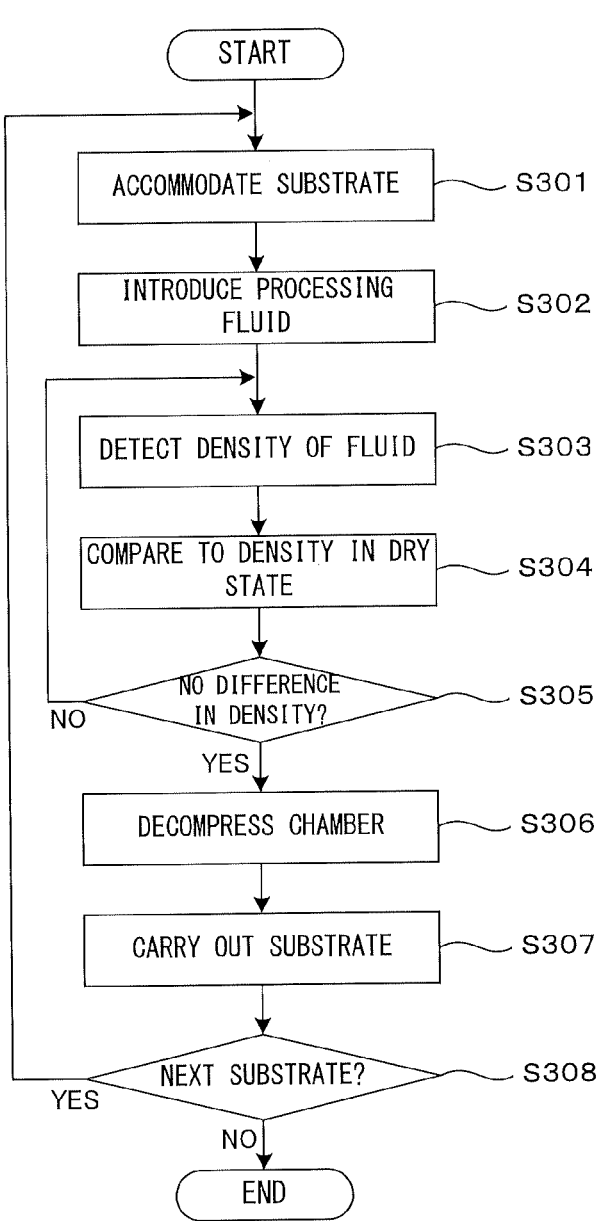

REPLACEMENT END TIME DETERMINATION METHOD, SUBSTRATE PROCESSING METHOD AND SUBSTRATE PROCESSING APPARATUS

CROSS-REFERENCE TO RELATED APPLICATIONS

The present application is a 35 U.S.C. §§ 371 national stage application of International Application No. PCT/JP2022/000094, filed Jan. 5, 2022, which claims priority to Japanese Patent Application No. 2021-011986, filed Jan. 28, 2021, the contents of which are incorporated herein by reference.

TECHNICAL FIELD

This invention relates to a technique for replacing a liquid to be replaced by a processing fluid in a supercritical state in a chamber and, particularly, to a method for determining an end time of replacement.

BACKGROUND ART

The process of processing various substrates such as a semiconductor substrate and a glass substrate for a display apparatus includes processing the surface of the substrate with various processing fluids. Although processing using liquids such as chemicals and rinses as the processing fluids has been widely performed in the past, processing using supercritical fluids has been put into practical use in recent years. In particular, in the processing of a substrate having a fine pattern formed on its surface, a supercritical fluid having a lower surface tension than a liquid penetrates deep into gaps among the pattern, whereby the processing may be performed efficiently. In addition, the risk of pattern collapse due to the surface tension may be reduced in a drying process.

A substrate processing apparatus for drying a substrate by replacing a liquid adhering to the substrate by a supercritical fluid is described, for example, in PTL 1. More specifically, a flow of a drying process in the case of using carbon dioxide as a supercritical fluid and IPA (isopropyl alcohol) as a liquid to be replaced by carbon dioxide is described in detail in PTL 1. In this process, the inside of a chamber accommodating the substrate is filled with the supercritical fluid. After the supercritical fluid containing the replaced liquid is discharged, the substrate is dried by decompressing the chamber and evaporating the supercritical fluid.

CITATION LIST

Patent Literature

PTL 1 JP 2018-081966A

SUMMARY

Technical Problem

If the evaporation of the supercritical fluid is started with the liquid to be replaced remaining in the chamber, the liquid to be replaced adheres to the substrate again, which may cause a drying failure. Thus, a processing recipe needs to be so constituted that the evaporation of the supercritical fluid is started after the liquid to be replaced is completely discharged from the chamber. However, a method for determining a completion timing of the discharge of the liquid to be replaced in the high-pressure chamber has not been established thus far. Thus, a problem that the liquid to be replaced adheres to the substrate again is at present avoided by maintaining a supercritical state longer than a time, which would be required to complete the discharge. In the above conventional technique, a pressure is reduced in a stepwise manner by repeating pressure increase and pressure reduction in a range not lower than a critical pressure. However, there is no clear description as to at which point of time the discharge of the liquid to be replaced can be said to be completed.

In such a conventional technique, a time required for the process and the consumption of the processing fluid are wasted and there is a problem that processing cost and environmental burdens increase. In view of this, it is desired to establish a technique for grasping an end timing of a replacement process in a chamber.

Solution to Problem

This invention was developed in view of the above problem and a first object is to provide a technique capable of properly determining an end timing of replacement in replacing a liquid to be replaced by a processing fluid in a supercritical state in a chamber. Further, a second object is to reduce a time required for a process and the consumption of the processing fluid by substrate processing using this technique.

One aspect of this invention relates to a replacement end time determination method in a process of replacing a liquid to be replaced by a processing fluid in a supercritical state in a chamber. To achieve the first object, this invention is provided with a first step of obtaining a density profile representing a change of a density of the processing fluid in the chamber with time while maintaining the processing fluid in the chamber in a supercritical state by supplying and discharging the fluid into and from the chamber in accordance with a predetermined supply/discharge recipe from a state where the liquid to be replaced is not present in the chamber, a second step of obtaining a density profile while maintaining the processing fluid in the chamber in the supercritical state by supplying and discharging the processing fluid into and from the chamber in accordance with the supply/discharge recipe from a state where the liquid to be replaced is present in the chamber, and a third step of determining the replacement end time based on the density profiles obtained in the respective first and second steps. Here, the supply/discharge recipe is determined in advance to fill the inside of the chamber with the processing fluid in the supercritical state.

In the third step, the density profiles obtained in the respective first and second steps are compared. A time at which the densities obtained in the respective first and second steps become substantially equal after the density obtained in the second step becomes larger than the density obtained in the first step is regarded as an end time of the replacement of the liquid to be replaced by the processing fluid.

In the invention thus configured, an end timing of the replacement of the liquid to be replaced by the processing fluid in the supercritical state can be properly grasped. The reason for that is as follows. Although described in detail later, the following characteristics are shown according to the knowledge obtained by the inventor of this application if a density change of a processing fluid in a chamber is measured while the processing fluid is supplied and discharged into and from the chamber in accordance with a predetermined supply/discharge recipe.

First, a density change determined by a balance between the amount of the processing fluid supplied to the chamber and the amount of the processing fluid discharged from the chamber appears in a state where the liquid to be replaced is not present in the chamber, i.e. in a state where the inside of the chamber is filled only with the processing fluid. On the other hand, if the processing fluid is supplied and discharged in a state where the liquid to be replaced is present in the chamber in advance, a state where the density is higher than in the state where the liquid to be replaced is not present continues at the beginning. However, a density difference is eliminated at a certain point of time and the density changes thereafter are almost the same.

Here, if the amount of the liquid to be replaced contained in the processing fluid is evaluated, the liquid to be replaced is contained in the processing fluid in the state where the density is larger than in the state where the liquid to be replaced is not present. On the other hand, after the density difference is eliminated, the liquid to be replaced is not contained in the processing fluid. In other words, the liquid to be replaced can be thought to remain in the processing fluid during a period in which the density difference is present and to no longer remain when the density difference is eliminated.

Accordingly, if the density profile in the state where the liquid to be replaced is not present in the chamber is measured, a timing at which the liquid to be replaced is no longer present can be grasped by comparing this density profile and the density profile in the state where the liquid to be replaced is present in the chamber. This is because a time at which the both densities coincide can be thought as a time at which the liquid to be replaced is no longer present.

Specifically, the replacement can be regarded to be finished when there is no longer a significant difference between the density profiles after the density profile in the state where the liquid to be replaced is present in the chamber indicates a higher density than the density profile in the state where the liquid to be replaced is not present. By doing so, the end timing of the replacement can be properly determined.

Further, another aspect of this invention relates to a substrate processing method for drying a substrate by replacing a liquid film of a liquid to be replaced covering a surface of the substrate by a processing fluid in a supercritical state and, to achieve the second object, the substrate processing method is provided with accommodating the substrate having the liquid film into a chamber, filling inside of the chamber with the processing fluid in the supercritical state by supplying and discharging the processing fluid into and from the chamber in accordance with a predetermined supply/discharge recipe, and drying the substrate by discharging the processing fluid from the chamber after the supercritical state is continued for a predetermined time.

Here, the predetermined time is determined according to a time at which a density of the processing fluid when the processing fluid in the chamber is maintained in the supercritical state by supplying and discharging the processing fluid into and from the chamber in accordance with the supply/discharge recipe from a state where the liquid to be replaced is present in the chamber becomes substantially equal to a density of the processing fluid when the processing fluid in the chamber is maintained in the supercritical state by supplying and discharging the processing fluid into and from the chamber in accordance with the supply/discharge recipe from a state where the liquid to be replaced is not present in the chamber after the former density becomes larger than the latter density.

Further, another aspect of this invention relates to a substrate processing method for drying a substrate by replacing a liquid film of a liquid to be replaced covering a surface of the substrate by a processing fluid in a supercritical state and, to achieve the second object, the substrate processing method is provided with accommodating the substrate having the liquid film into a chamber, filling inside of the chamber with the processing fluid in the supercritical state by supplying and discharging the processing fluid into and from the chamber based on a predetermined supply/discharge recipe, detecting a density of the processing fluid in the chamber and determining an end time of the replacement based on a detection value, and drying the substrate by discharging the processing fluid from the chamber after an end of the replacement is determined.

In these methods, the end time of the replacement is determined based on a density change of the processing fluid in the chamber measured in advance while the processing fluid in the chamber is maintained in the supercritical state by supplying and discharging the processing fluid into and from the chamber in accordance with the supply/discharge recipe from the state where the liquid to be replaced is not present and the detection value.

Further, another aspect of this invention relates to a substrate processing apparatus for drying a substrate by replacing a liquid film of a liquid to be replaced covering a surface of the substrate by a processing fluid in a supercritical state and, to achieve the second object, the substrate processing apparatus is provided with a chamber for accommodating the substrate having the liquid film, a supply/discharge part for supplying and discharging the processing fluid into and from the chamber based on a predetermined supply/discharge recipe, a density detector for detecting a density of the processing fluid in the chamber, and a controller for determining an end time of the replacement based on a density change of the processing fluid in the chamber detected by the density detector in advance while the processing fluid in the chamber is maintained in the supercritical state by supplying and discharging the processing fluid into and from the chamber in accordance with the supply/discharge recipe from a state where the liquid to be replaced is not present in the chamber and a detection value of the density detected by the density detector.

In the invention thus configured, an end timing of the replacement of the liquid to be replaced by the processing fluid can be properly grasped by the above principle. Thus, wastes due to the supercritical state continued more than necessary can be suppressed while a drying failure due to the evaporation of the processing fluid with the liquid to be replaced remaining in the chamber is reliably prevented. As a result, reductions in processing time and the consumption of the processing fluid can be realized.

Advantageous Effects of Invention

As described above, in the invention, a timing at which the liquid to be replaced has been eliminated can be properly grasped by determining an end time of a replacement process based on a density change of a processing fluid in a chamber. Further, by using that knowledge, a processing time and the consumption of the processing fluid in substrate processing can be reduced.

The above and further objects and novel features of the invention will more fully appear from the following detailed description when the same is read in connection with the 5                                                           6 accompanying drawing. It is to be expressly understood, however, that the drawing is for purpose of illustration only and is not intended as a definition of the limits of the invention.

BRIEF DESCRIPTION OF DRAWINGS

FIG. 1 is a drawing showing a schematic configuration of a substrate processing apparatus according to the present invention.

FIG. 2 is a flow chart showing a summary of a process performed by this substrate processing apparatus.

FIG. 3 is a timing chart showing a state change of each part in the supercritical process.

FIG. 5 is a flow chart showing a modification of the supercritical drying process.

DESCRIPTION OF EMBODIMENTS

Figure 1:
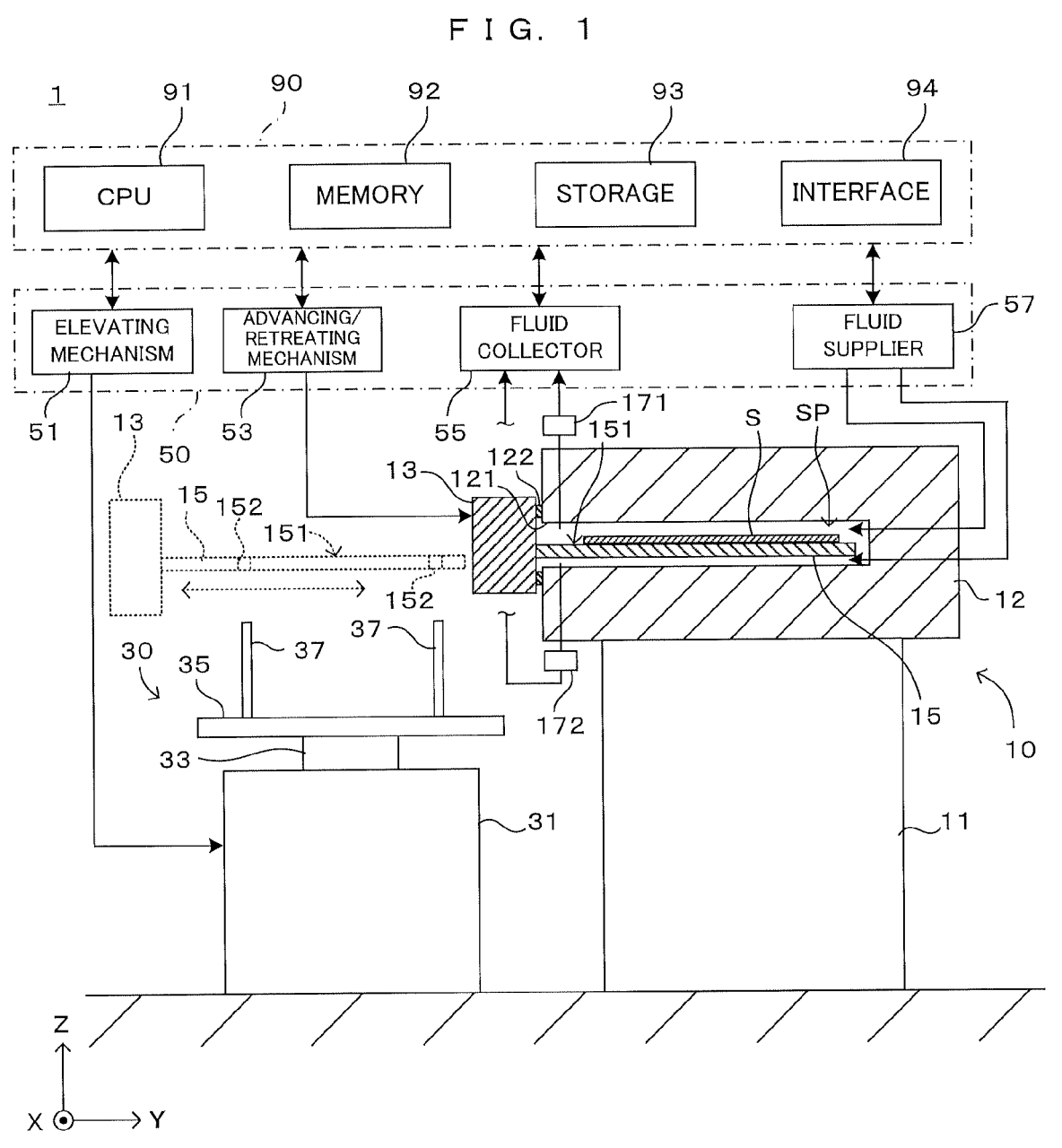
Figure 4:
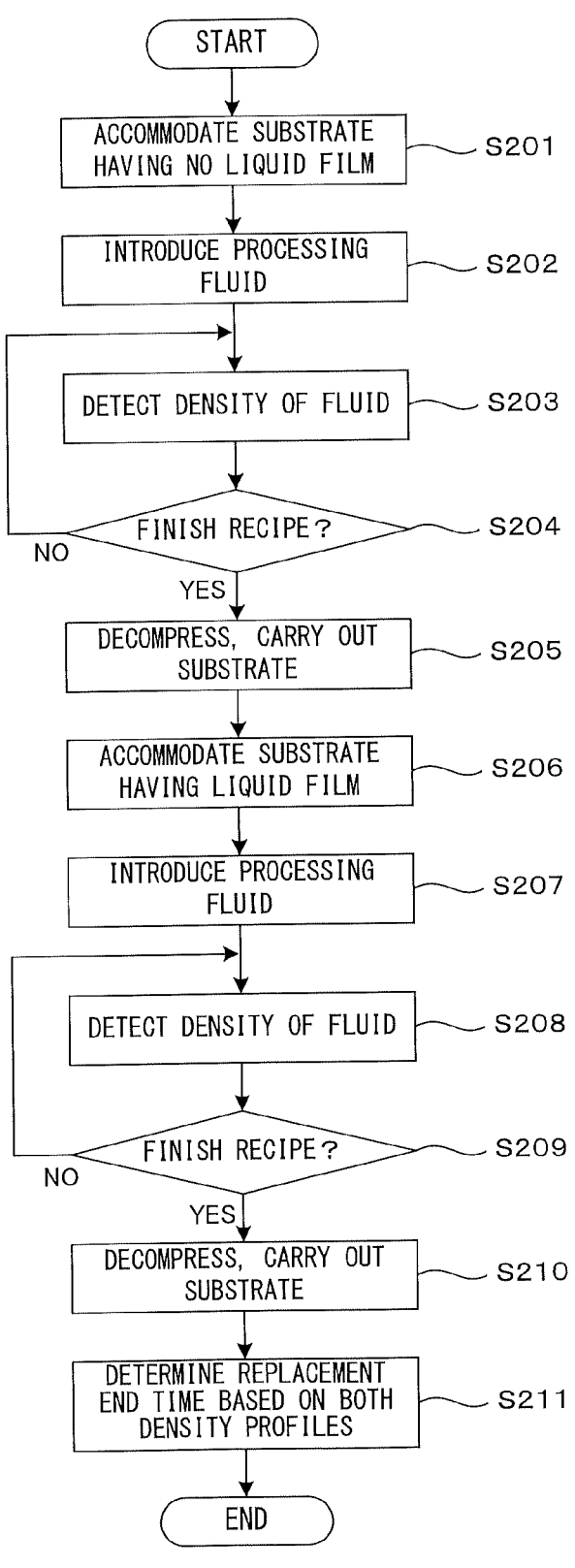
FIG. 4 is a flow chart showing a replacement end time determination process in this embodiment.

FIG. 1 is a drawing showing a schematic configuration of a substrate processing apparatus according to the present invention. This substrate processing apparatus 1 is an apparatus for processing surfaces of various substrates such as semiconductor substrates using supercritical fluids. Its device construction is preferably capable of performing a replacement end time determination method and a substrate processing method according to the present invention. To show directions in each figure in a unified manner below, an XYZ orthogonal coordinate system is set as shown in FIG. 1. Here, an XY plane represents a horizontal plane and a Z direction represents a vertical direction. More specifically, a (−Z) direction represents a vertically downward direction.

Various substrates such as semiconductor wafers, glass substrates for photomask, glass substrates for liquid crystal display, glass substrates for plasma display, substrates for FED (Field Emission Display), substrates for optical disk, substrates for magnetic disk, and substrates for magneto-optical disk can be adopted as the "substrate" in this embodiment. A substrate processing apparatus used to process a disk-shaped semiconductor wafer is mainly described as an example with reference to the drawings. But the substrate processing apparatus can be adopted also to process various substrates illustrated above. Also as a shape of the substrate, various types are applicable.

The substrate processing apparatus 1 includes a processing unit 10, a transfer unit 30, a supply unit 50 and a control unit 90. The processing unit 10 serves as an execution subject of a supercritical drying process. The transfer unit 30 receives an unprocessed substrate S transported by an external conveying device not shown in the figure and carries the substrate S into the processing unit 10. Further, the transfer unit 30 delivers a processed substrate S from the processing unit 10 to the external conveying device. The supply unit 50 supplies chemical substances, power, energy and the like necessary for the process to the processing unit 10 and the transfer unit 30.

The control unit 90 realizes a predetermined process by controlling these components of the apparatus. For this purpose, the control unit 90 includes a CPU 91, a memory 92, a storage 93, an interface 94, and the like. The CPU 91 executes various control programs. The memory 92 temporarily stores processing data. The storage 93 stores the control programs to be executed by the CPU 91. The interface 94 exchanges information with a user and an external apparatus. Operations of the apparatus to be described later are realized by the CPU 91 causing each component of the apparatus to perform a predetermined operation by executing the control program written in the storage 93 in advance.

The processing unit 10 has a structure in which a processing chamber 12 is settled on a pedestal 11. The processing chamber 12 is structured by a combination of several metal blocks which form a hollow inside serving as a processing space SP. A substrate S to be processed is carried into the processing space SP to be processed. A slit-like aperture 121 elongated in an X direction is formed in a (−Y) side surface of the processing chamber 12. The processing space SP communicates with an outside space via the aperture 121. That is, the processing SP is a hollow having a cross-sectional shape that is long in the X direction and short in the Z direction and elongated in the Y direction.

A lid member 13 is provided on the (−Y) side surface of the processing chamber 12 to close the aperture 121. A hermetic processing chamber is constructed by closing the aperture 121 of the processing chamber when the aperture 121 is closed by the lid member 13. By doing so, a processing to the substrate S under a high pressure in the internal processing space SP is allowed. A support tray 15 in the form of a flat plate is attached in a horizontal posture to a (+Y) side surface of the lid member 13. An upper surface 151 of the support tray 15 serves as a support surface on which the substrate S can be placed. The lid member 13 is supported horizontally movably in a Y direction by an unillustrated support mechanism.

The lid member 13 is movable toward and away from the processing chamber 12 by an advancing/retracting mechanism 53 provided in the supply unit 50. Specifically, the advancing/retracting mechanism 53 includes a linear motion mechanism such as a linear motor, a linear guide, a ball-screw mechanism, a solenoid or an air cylinder. Such a linear motion mechanism moves the lid member 13 in the Y direction. The advancing/retracting mechanism 53 operates in response to a control command from the control unit 90.

By a movement of the lid member 13 in a (−Y) direction, the lid member 13 separates away from the processing chamber 12. If the support tray 15 is pulled out from the processing space SP to outside via the aperture 121 as shown by the dotted lines, the support tray 15 is accessible from outside. Specifically, it becomes possible to place the substrate S on the support tray 15 and take out the substrate S placed on the support tray 15. On the other hand, the lid member 13 moves in a (+Y) direction, whereby the support tray 15 is accommodated into the processing space SP. If the substrate S is placed on the support tray 15, the substrate S is carried into the processing space SP together with the support tray 15.

The lid member 13 moves in the (+Y) direction to close the aperture 121, whereby the processing space SP is sealed. A sealing member 122 is provided between the (+Y) side surface of the lid member 13 and the (−Y) side surface of the processing chamber 12 and an airtight state of the processing space SP is maintained. The seal member 12 is made of rubber material, for example. Further, the lid member 13 is fixed to the processing chamber 12 by an unillustrated lock mechanism. As described above, in this embodiment, the lid member 13 is switched between a closing state (solid line) to close the aperture 121 and seal the processing space SP and a separating state (dotted line) to enable the substrate S to pass through by separating widely from the aperture 121.

The substrate S is processed in the processing space SP with the airtight state of the processing space SP ensured in this way. In this embodiment, a fluid of a substance usable for a supercritical process, e.g. carbon dioxide, is sent from a fluid supplier 57 provided in the supply unit 50 as the processing fluid. The processing fluid is supplied to the processing unit 10 in a gaseous, liquid or supercritical state. Carbon dioxide is a chemical substance suitable for the supercritical drying process in having properties of entering a supercritical state at relatively low temperature and low pressure and dissolving an organic solvent often used in substrate processing well. At a critical point of carbon dioxide at which the fluid comes into the supercritical state, a pressure (critical pressure) is 7.38 MPa and a temperature (critical temperature) is 31.1° C.

The processing fluid is filled into the processing space SP. When suitable temperature and pressure are reached in the processing space SP, the processing space SP is filled with the processing fluid in the supercritical state. In this way, the substrate S is processed by the supercritical fluid in the processing chamber 12. The supply unit 50 is provided with a fluid collector 55, and the fluid after the process is collected into the fluid collector 55. The fluid supplier 57 and the fluid collector 55 are controlled by the control unit 90.

The processing space SP has a shape and a volume capable of receiving the support tray 15 and the substrate S supported by the support tray 15. That is, the processing space SP has a substantially rectangular cross-sectional shape wider than a width of the support tray 15 in a horizontal direction and larger than the sum of heights of the support tray 15 and the substrate S in the vertical direction and has a depth capable of receiving the support tray 15. As just described, the processing space SP has a shape and a volume enough to receive the support tray 15 and the substrate S. However, gaps between the support tray 15 and the substrate S and the inner wall surface of the processing space SP are tiny. Therefore, the amount of the processing fluid necessary to fill the processing space SP is relatively small.

With the support tray 15 accommodated in the processing space SP, the processing space SP is largely divided into two, i.e. spaces above and below the support tray 15. If the substrate S is placed on the support tray 15, the processing space SP is divided into a space above the upper surface of the substrate S and a space below the lower surface of the support tray 15.

The fluid supplier 57 supplies the processing fluid to each of the space above the substrate S and the space below the support tray 15, out of the processing space SP, on a (+Y) side further than a (+Y) side end part of the substrate S. On the other hand, the fluid collector 55 discharges the processing fluid from each of the space above the substrate S and the space below the support tray 15, out of the processing space SP, on a (−Y) side further than a (−Y) side end part of the substrate S. In this way, laminar flows of the processing fluid from the (+Y) side toward the (−Y) side are respectively formed above the substrate S and below the support tray 15 in the processing space SP.

Density detectors 171, 172 for detecting a density of the processing fluid discharged from the processing space SP are provided in pipes serving as discharge paths of the processing fluid from the processing space SP to the fluid collector 55. Specifically, the density detector 171 is provided in the pipe for discharging the processing fluid from a space above the support tray 15, out of the processing space SP. Further, the density detector 172 is provided in the pipe for discharging the processing fluid from a space below the support tray 15, out of the processing space SP.

Coriolis flow meters can be, for example, used as the density detectors 171, 172. The density of the processing fluid in the processing space SP can be detected by the density detectors 171, 172. For the purpose of measuring a density of a fluid in a chamber, the pipes constituting flow passages of the processing fluid from the processing space SP to the density detectors 171, 172 desirably have a small pressure loss. Further, density detectors may be arranged to directly face the processing space SP.

The transfer unit 30 transfers the substrate S between an external conveying device and the support tray 15. To this end, the transfer unit 30 is provided with a body 31, an elevating member 33, a base member 35 and a plurality of lift pins 37. The elevating member 33 is a columnar member extending in the Z direction, and supported movably in the Z direction with respect to the body 31 by an unillustrated supporting mechanism. The base member 35 having a substantially horizontal upper surface is mounted atop the elevating member 33. The plurality of lift pins 37 stand upward from the upper surface of the base member 35. Each of the lift pins 37 supports the substrate S in a horizontal posture from below by the contact of an upper end part thereof with the lower surface of the substrate S. To stably support the substrate S in the horizontal posture, it is desirable to provide three or more lift pins 37 having the upper end parts located at the same height.

The elevating member 33 is movable up and down by an elevating mechanism 51 provided in the supply unit 50. Specifically, the elevating mechanism 51 includes a linear motion mechanism such as a linear motor, a linear motion guide, a ball screw mechanism, a solenoid or an air cylinder, and such a linear motion mechanism moves the elevating member 33 in the Z direction. The elevating mechanism 51 operates in response to a control command from the control unit 90.

The base member 35 is moved up and down by upward and downward movements of the elevating member 33, and the plurality of lift pins 37 are moved up and down integrally with the base member 35. In this way, the transfer of the substrate S between the transfer unit 30 and the support tray 15 is realized. More specifically, as shown by dotted lines in FIG. 1, the substrate S is transferred with the support tray 15 pulled out to the outside of the chamber. To this end, the support tray 15 is provided with through holes 152, through which the lift pins 37 are inserted. If the base member 35 moves up, the upper ends of the lift pins 37 reach positions above the upper surface 151 of the support tray 15 through the through holes 152. In this state, the substrate S being conveyed by the external conveying device is transferred to the lift pins 37. The lift pins 37 move down, whereby the substrate S is transferred from the lift pins 37 to the support tray 15. The substrate S can be carried out in a procedure opposite to the above one.

FIG. 2 is a flow chart showing a summary of a process performed by this substrate processing apparatus. This substrate processing apparatus 1 performs a supercritical drying process, i.e. a process of drying the substrate S cleaned with a cleaning liquid in a previous process. Specifically, this process is as follows. The substrate S to be processed is cleaned with the cleaning liquid in the previous process performed in another substrate processing apparatus constituting a substrate processing system. Thereafter, the substrate S is conveyed to the substrate processing apparatus 1 with a liquid film by an organic solvent such as isopropyl alcohol (IPA) formed on a surface.

For example, if a fine pattern is formed on the surface of the substrate S, the pattern may collapse due to surface tension of the liquid remaining on and adhering to the substrate S. Further, watermarks may remain on the surface of the substrate S due to incomplete drying. Further, the surface of the substrate S may be altered such as through oxidation by being exposed to outside air. To prevent such problems, the substrate S may be conveyed with the surface (pattern forming surface) of the substrate S covered by a liquid or solid surface layer.

For example, if the cleaning liquid contains water as a main component, conveyance is carried out with the liquid film formed by a liquid having a lower surface tension than the cleaning liquid and low corrosiveness to the substrate, e.g. an organic solvent such as IPA or acetone. That is, the substrate S is conveyed to the substrate processing apparatus 1 while being supported in a horizontal state and having the liquid film formed on the upper surface thereof. Here, it is assumed that IPA is used as an example of the liquid film material.

The substrate S conveyed by the unillustrated conveying device is accommodated into the processing chamber 12 (Step S101). Specifically, the substrate S is conveyed with the pattern forming surface serving as the upper surface and the upper surface covered by a thin liquid film. As shown by dotted lines in FIG. 1, the lift pins 37 move up with the lid member 13 moved to the (−Y) side and the support tray 15 pulled out. The conveying device transfers the substrate S to the lift pins 37. The lift pins 37 move down, whereby the substrate S is placed on the support tray 15. When the support tray 15 and the lid member 13 integrally move in the (+Y) direction, the support tray 15 supporting the substrate S is accommodated into the processing space SP in the processing chamber 12 and the opening 121 is closed by the lid member 13.

In this state, carbon dioxide serving the processing fluid is introduced in a gas phase state into the processing space SP (Step S102). Outside air enters the processing space SP when the substrate S is carried in, but it can be replaced by introducing the processing fluid in the gas phase. Further, by injecting the processing fluid in the gas phase, a pressure in the processing chamber 12 increases.

Note that, in the process of introducing the processing fluid, the processing fluid is continually discharged from the processing space SP. That is, the processing fluid is discharged from the processing space SP by the fluid collector 55 also while the processing fluid is being introduced by the fluid supplier 57. In this way, the processing fluid used for the process is discharged without convection in the processing space SP, thereby preventing impurities such as the remaining liquid taken into the processing fluid from adhering to the substrate S again.

If the supply amount of the processing fluid is more than the discharge amount, the density of the processing fluid in the processing space SP increases and the chamber internal pressure increases. Conversely, if the supply amount of the processing fluid is less than the discharge amount, the density of the processing fluid in the processing space SP decreases and the inside of the chamber is decompressed. The supply of the processing fluid into the processing chamber 12 and the discharge thereof from the processing chamber 12 are performed based on a supply/discharge recipe prepared in advance. That is, the control unit 90 controls the fluid supplier 57 and the fluid collector 55 based on the supply/discharge recipe, whereby supply and discharge timings, flow rates and the like of the processing fluid are adjusted.

If the pressure of the processing fluid in the processing space SP increases and exceeds a critical pressure, the processing fluid enters a supercritical state in the chamber. That is, due to a phase change in the processing space SP, the processing fluid transitions from the gas phase to the supercritical state. Note that the processing fluid in the supercritical state may be supplied from outside. By introducing the supercritical fluid into the processing space SP, the organic solvent such as IPA covering the substrate S is replaced by the supercritical fluid. The organic solvent isolated from the surface of the substrate S is discharged from the processing chamber 12 together with the processing fluid while being dissolved in the processing fluid, and removed from the substrate S. That is, the processing fluid in the supercritical state has a function of replacing the organic solvent adhering to the substrate S as a liquid to be replaced and discharging the organic solvent to the outside of the processing chamber 12.

When the replacement of the liquid to be replaced by the supercritical fluid is finished in the processing chamber 12 (Step S103), the substrate S is dried by discharging the processing fluid in the processing space SP. Specifically, the inside of the processing chamber 12 filled with the processing fluid in the supercritical state is decompressed by increasing a discharge amount of the fluid from the processing space SP (Step S104). At this time, the supply of the processing fluid may be stopped or a small amount of the processing fluid may continue to be supplied. By decompressing the processing space SP from the state filled with the supercritical fluid, the processing fluid undergoes a phase change from the supercritical state to the gas phase. By discharging the vaporized processing fluid to outside, the substrate S is dried. At this time, a decompression speed is regulated so as not to create a solid phase and a liquid phase due to a sudden temperature drop. In this way, the processing fluid in the processing space SP is directly vaporized from the supercritical state and discharged to outside. Therefore, the formation of a gas-liquid interface on the substrate S having the exposed surface after drying is avoided.

As just described, in the supercritical drying process of this embodiment, the liquid adhering to the substrate S can be efficiently replaced and prevented from remaining on the substrate S by changing the phase of the processing fluid to the gas phase and discharging the processing fluid after the processing space SP is filled with the processing fluid in the supercritical state. Moreover, the substrate can be dried while avoiding problems caused due to the formation of the gas-liquid interface such as the contamination of the substrate by adhering impurities and pattern collapse.

The processed substrate S is delivered to a subsequent process (Step S105). That is, the lid member 13 moves in the (−Y) direction, whereby the support tray 15 is pulled out to outside from the processing chamber 12 and the substrate S is transferred to the external conveying device via the transfer unit 30. At this time, the substrate S is in the dried state. The content of the subsequent process is arbitrary. Unless there is a substrate to be processed next (NO in Step S106), the process is finished. If there is another substrate to be processed (YES in Step S106), return is made to Step S101, the substrate S is newly received and the above process is repeated.

If the next substrate S is successively processed after the process for one substrate S is finished, a tact time can be shortened as follows. That is, after the support tray 15 is pulled out and the processed substrate S is carried out, the support tray 15 is accommodated into the processing chamber 12 after a new unprocessed substrate S is placed thereon. Further, by reducing the number of opening and closing the lid member 13 in this way, an effect of suppressing a temperature change in the processing chamber 12 due to the entrance of outside air is also obtained.

Next, a method for determining at which point of time the replacement of the liquid to be replaced by the supercritical fluid is regarded to be finished is described. As described above, after the replacement of the liquid to be replaced by the supercritical fluid is finished, the substrate is dried by decompressing the inside of the chamber and evaporating the processing fluid. Here, if the processing fluid is evaporated with the liquid to be replaced remaining in the processing space SP, the liquid to be replaced may adhere to the substrate S again to cause a drying failure. To avoid this, the evaporation of the processing fluid needs to occur in a state where the replacement by the processing fluid is finished, i.e. in a state where the liquid to be replaced is completely discharged from the processing space SP.

To that end, an end timing of the replacement process in the chamber needs to be properly grasped. However, a method for determining whether or not the liquid to be replaced has been completely discharged from the processing chamber 12 under a high pressure has not been known yet. Thus, a method for reliably avoiding the remaining of the liquid to be replaced has been adopted thus far by maintaining the supercritical state longer than a period estimated to be necessary to complete the replacement process.

In this case, the supercritical state is maintained also after the liquid to be replaced is completely discharged. Thus, a processing time and the consumption of the processing fluid increase. Further, it is not guaranteed that the replacement has been reliably finished. From this, it is required to more reliably grasp the end timing of the replacement process. One method for that is specifically described below.

FIG. 3 is a timing chart showing a state change of each part in the supercritical process. More specifically, FIG. 3 is a chart showing a relationship between supply and discharge timings of the processing fluid based on the supply/discharge recipe and state changes in the processing chamber 12 associated with these timings. First, the supply/discharge recipe specifying the supply and discharge timings of the processing fluid and the amounts of the processing fluid is described.

In an initial state, the lid member 13 is opened to accommodate the substrate S into the processing chamber 12 and the processing space SP is open to an atmosphere. That is, the chamber internal pressure is almost an atmospheric pressure Pa and sufficiently smaller than the critical pressure Pc. On the other hand, since a critical temperature Tc of carbon dioxide serving as the processing fluid is close to a room temperature, a chamber internal temperature is close to the critical temperature Tc. Although the chamber internal temperature is slightly higher than the critical temperature Tc in FIG. 3, the chamber internal temperature is possibly lower than the critical temperature Tc in some cases.

After the substrate S is accommodated, the processing fluid in the gas phase starts to be introduced into the processing space SP at time T1. At this time, the processing fluid is also discharged at a certain rate. By setting a supply flow rate larger than a discharge flow rate, the chamber internal pressure gradually increases. If the chamber internal temperature is higher than the critical temperature Tc at time T2 at which the chamber internal pressure reaches the critical pressure Pc, the processing fluid undergoes a phase transition to the supercritical state.

At time T3, the supply amount of the processing fluid is adjusted to an amount for maintaining the chamber internal pressure substantially constant and, thereafter, the chamber internal pressure is kept substantially constant. At time T4, decompression is started. That is, while the supply amount of the processing fluid is largely reduced, the discharge amount is largely increased. In this way, the processing fluid is excessively discharged and the chamber internal pressure is suddenly reduced. The chamber internal temperature is also reduced according to sudden expansion of the processing fluid.

At time T5 at which the chamber internal pressure falls below the critical pressure Pc or the chamber internal temperature falls below the critical temperature Tc, the processing fluid undergoes a phase transition to the gas phase. At and after time T6 at which the chamber internal pressure is reduced substantially to the atmospheric pressure Pa, the processing space SP can be opened to the atmosphere and the substrate S can be carried out. A decompression rate is so set that the processing fluid in the critical state transitions to the gas phase without via a liquid phase.

The inventor of this application observed a density change of a fluid in a chamber in such a series of processes and acquired the following knowledge. An example of an observed density change is shown in a lower part of FIG. 3. The density change in a state where the liquid to be replaced is not present in the chamber in the initial state is shown by a solid line. The density of the fluid in the chamber can be said to depend on the temperature and pressure in the chamber and transition, substantially following a pressure change if a temperature change is small.

On the other hand, if the processing fluid is similarly supplied and discharged in a state where the liquid to be replaced is present in the chamber in advance, the density is higher than in the state where the liquid to be replaced is not present as shown by a broken line and a dotted line in FIG. 3 and, thereafter, a density difference gradually decreases and transitions substantially in the same manner as in the state where the liquid to be replaced is not present at and after time Tx. There are possibly a case where the density is high from the beginning as shown by the broken line and a case where the density increase is delayed as shown by the dotted line. However, in either case, a higher density than in the state where the liquid to be replaced is not present is finally reached. This is thought to be because, by dissolving the liquid to be replaced in the processing fluid in the supercritical state, the density of the processing fluid in the supercritical state becomes higher than that of the processing fluid not containing the liquid to be replaced at the same pressure and temperature.

By continuing the supply and discharge of the processing fluid, a concentration of the liquid to be replaced in the chamber is gradually reduced and the remaining amount of the liquid to be replaced finally becomes zero. The aforementioned reduction in the density difference with time and the transition of the density change at and after time Tx can be thought to correspond to this situation.

It is thought to measure density profiles representing a change of the density of the fluid in the chamber with time as described above in each of the state where the liquid to be replaced is present in the processing space SP and the state where the liquid to be replaced is not present and to compare those. By doing so, a timing at which the liquid to be replaced is completely removed from the inside of the processing space SP, i.e. the replacement by the processing fluid is finished, can be grasped. A replacement end time determination method based on this principle is described below.

FIG. 4 is a flow chart showing a replacement end time determination process in this embodiment. This process includes:

(1) a step of obtaining the density profile in the state where the liquid to be replaced is not present in the chamber (Steps S201 to S205), (2) a step of obtaining the density profile in the state where the liquid to be replaced is present in the chamber (Steps S206 to S210), and (3) a step of determining a replacement end time based on the comparison of the density profiles (Step S211). In the following description, the "state where the liquid to be replaced is not present in the chamber" may be referred to as a "dry state" and the "state where the liquid to be replaced is present in the chamber" may be referred to as a "wet state".

First, the density profile in the dry state where the liquid to be replaced is not present in the chamber is obtained. Specifically, the substrate S having no liquid film formed on the surface is accommodated into the chamber (Step S201) and the processing fluid is introduced into the chamber in accordance with the supply/discharge recipe determined in advance (Step S202). During this time, the density of the fluid in the chamber at each time is detected (Step S203), whereby the density profile representing a change of the fluid density with time is obtained.

The density of the fluid in the chamber can be detected by the density detectors 171, 172 provided in the discharge paths of the processing fluid from the processing chamber 12. By using mass flow meters such as Coriolis flow meters as the density detectors 171, 172, the density of the fluid can be obtained by measuring a mass flow rate of the flowing fluid. A detection result of either one of the two density detectors 171, 172 or an average value of the respective detection results may be used for density detection in this case.

If the supply and discharge of the processing fluid based on the supply/discharge recipe are finished (Step S204), the inside of the chamber is decompressed and finally opened to the atmosphere and the substrate S is carried out (Step S205). The density profile in the dry state is obtained by the process thus far.

A supply/discharge recipe assuming an actual supercritical drying process as shown in FIG. 3 can be, for example, used as the supply/discharge recipe. However, for more simplicity, the supply and discharge of the processing fluid at certain rates may be, for example, sustained as long as the supercritical state can be maintained. However, in the sense of obtaining data reflecting a state during an actual process, it is desirable to follow the supply/discharge recipe in the supercritical drying process.

Note that, as described later, an actual processing recipe needs not be considered particularly for a process after a start time of the decompression in the chamber since the supply/discharge recipe can be optimized using the processing result here. Further, the density profile is obtained by accommodating the substrate S having no liquid film formed thereon in the chamber here. However, for more simplicity, the density profile can also be obtained without accommodating the substrate S.

Subsequently, the density profile in the wet state where the liquid to be replaced is present in the chamber is obtained. Specifically, the substrate S having a liquid film by the liquid to be replaced formed on the surface is accommodated into the chamber (Step S206) and the processing fluid is introduced into the chamber in accordance with the same supply/discharge recipe as the above one (Step S207). The density of the fluid in the chamber is detected at each time until the recipe is finished (Steps S208, S209), whereby the density profile in the wet state where the liquid to be replaced is present in the chamber is obtained. Thereafter, the inside of the chamber is decompressed and the substrate S is carried out (Step S210).

The replacement end time in the process in accordance with the supply/discharge recipe is determined based on the density profiles respectively obtained in the dry state and the wet state (Step S211). Specifically, the both profiles are compared at times having the same elapsed time from the start of the process, thereby specifying a time (time Tx in FIG. 3) at which a difference between the density in the wet state and the density in the dry state becomes substantially zero after the density in the wet state significantly exceeds the density in the dry state. A "significantly exceeding" event and an event in which the "difference becomes substantially zero" can be determined by comparing the density difference between the wet state and the dry state to a threshold value appropriately set for each of the both events.

If the replacement end time is specified in this way, the supply/discharge recipe of FIG. 3 can be revised and the process can be optimized as follows. That is, at specified time Tx, the replacement of the liquid to be replaced by the supercritical processing fluid has been completed and the liquid to be replaced has been removed from the processing space SP. Therefore, the processing fluid may be evaporated and discharged at and after this time Tx and the supercritical state needs not be maintained.

That is, decompression in the chamber set at time T4 at present (FIG. 3) may be advanced to time Tx, whereby a processing time can be shortened and the consumption of the processing fluid can be reduced. Specifically, determination as to whether or not the replacement has been finished in Step S103 of the flow chart of FIG. 2 can be made by determining "whether or not the time Tx has been exceeded". Further, the value of the pressure in the chamber or the fluid density at time Tx may be obtained in advance and set as a threshold value and the "end of the replacement" may be determined when those values detected during the process reach the threshold value.

By doing so, it can be avoided that the supercritical state is maintained unnecessarily long, and the processing time can be shortened and the consumption of the processing fluid can be reduced. Note that, in consideration of measurement errors and a variation of the process, a certain margin may be given to these threshold values. Also in this case, since the end timing of the replacement is specified, increases in the processing time and fluid consumption caused by giving a larger margin than necessary can be suppressed.

Further, from the perspective of maintaining the supercritical state at time Tx, decompression may be started earlier than the time Tx and the evaporation of the processing fluid may be started at a point of time after the time Tx. However, since the supply/discharge recipe before time Tx is changed, the time Tx itself possibly varies. Thus, whether or not the supercritical process satisfactorily proceeds also in such a changed supply/discharge recipe needs to be verified separately. Specifically, it is necessary to confirm that the supercritical state is maintained at the replacement end time Tx in the changed supply/discharge recipe. To that end, the replacement end time Tx may be specified by performing the determination process of FIG. 4 for the changed supply/discharge recipe and whether or not the chamber internal pressure and temperature at that time are higher than critical points may be determined. If the supercritical state has been escaped at this point of time, a decompression start time needs to be delayed.

The determination of the replacement end time and the adjustment of the supply/discharge recipe based on that determination described above need to be performed when the use of the substrate processing apparatus 1 is started and are preferably performed for each individual apparatus. Further, of course, these need to be performed again when a certain change is made in process conditions such as in the case of changing the type of the substrates S or the liquid to be replaced or in the case of changing the supply/discharge recipe. Further, these are desirably regularly performed during the maintenance of the apparatus or the like.

Note that, in the above embodiment, the replacement end time Tx is obtained in advance, and the end of the super-critical process is determined when this time Tx elapses or a detection value of the pressure or the like reaches a value corresponding to the time Tx. In contrast, if the supercritical drying process is modified as follows, similar effects can be obtained even if the replacement end time Tx is not obtained in advance. As a prerequisite of this process, it is assumed that Steps S201 to S205 of FIG. 4 are performed beforehand to obtain the density profile in the dry state in advance.

FIG. 5 is a flow chart showing a modification of the supercritical drying process. The substrate S is accommodated into the chamber and the processing fluid is introduced in accordance with the predetermined supply/discharge recipe as in the above embodiment (Steps S301, 302). A method for determining the end time of the replacement process is different from that of the above embodiment. In this modification, the density of the processing fluid in the chamber is detected (Step S303) and compared to a detection value at a corresponding time in the density profile in the dry state obtained in advance (Step S304).

As described above, the density of the fluid is higher in the wet state than in the dry state at the beginning and, thereafter, a density difference becomes smaller and is almost eliminated at and after time Tx. Accordingly, the replacement process can be regarded to be finished if there is no substantial density difference between the wet state and the dry state (Step S305). That is, in this modification, the density of the fluid during the process is constantly detected, and the end of the replacement is regarded when the density change coincides with the density profile in the dry state obtained in advance. Also by this, it can be avoided that the supercritical state is maintained unnecessarily long and the processing time can be shortened and the consumption of the processing fluid can be reduced as in the above embodiment.

The process after the end of the replacement is the same as in the above embodiment. That is, the process is performed for a plurality of substrates by repeating the above process if necessary after the inside of the chamber is decompressed and the substrate is carried out (Steps S306 to S308).

As described above, in this embodiment, the replacement end time of the liquid to be replaced by the processing fluid is determined based on the density profile in the dry state where the liquid to be replaced is not present in the chamber and the density profile in the wet state where the liquid to be replaced is present in the chamber. Thus, a duration of the time, which has been conventionally set longer to prevent a drying failure and during which the supercritical state is maintained, can be optimized. In this way, the processing time can be shortened and the consumption of the processing fluid can be reduced.

If the density profile is obtained in each of the dry state and the wet state and the replacement end time is specified in advance, the processing recipe of the supercritical drying process can be optimized based on that knowledge. By doing so, the supercritical drying process thereafter can be efficiently and satisfactorily performed. Further, similar effects can be obtained even if the supercritical drying process is performed based on the density profile obtained in the dry state and a density detection result during an actual process.

As described above, in this embodiment, the processing chamber 12 functions as a "chamber" of the invention, and the density detectors 171, 172 correspond to a "density detector" and a "mass flow meter" of the invention. Further, the fluid supplier 57 and the fluid collector 55 integrally function as a "supply/discharge part" of the invention. Further, the control unit 90 functions as a "controller" of the invention.

Steps S201 to S205 in the flow chart of FIG. 4 correspond to a "first step" of the invention, Steps S206 to S210 correspond to a "second step" of the invention, and Step S211 corresponds to a "third step" of the invention. On the other hand, in the modification of the supercritical drying process shown in FIG. 5, Steps S201 to S205 in FIG. 4 performed in advance correspond to the "first step" of the invention, Step S303 in FIG. 5 corresponds to the "second step" of the invention, and Steps S304 to S305 correspond to the "third step" of the invention.

Note that the invention is not limited to the above embodiment and various changes other than the aforementioned ones can be made without departing from the gist of the invention. For example, in the above embodiment, the replacement end time determination method according to the invention is applied for the purpose of optimizing the processing recipe of the supercritical drying process. However, an application target of this method is not limited to this. For example, the invention may be used to determine an end time of a replacement process in performing the next process after the end of the replacement process.

Further, for example, the density detectors 171, 172 are provided in the discharge paths of the processing fluid in the substrate processing apparatus 1 of the above embodiment. However, the disposed positions of these are not limited to the above ones as long as the density of the fluid in the chamber can be detected. Further, in the above embodiment, the discharge paths are respectively connected to the spaces above and below the support tray 15, out of the processing space SP, and the density detector is arranged in each of those discharge paths. However, the positions and number of the discharge paths are arbitrary, and the arrangement of the density detectors can be appropriately changed accordingly. Further, the density detector is not limited to the Coriolis flow meter.

Further, in a mode for specifying the replacement end time Tx and optimizing the processing recipe based on the specified replacement end time Tx in advance, it is not an essential requirement to detect the density in the actual supercritical drying process. Thus, the density detectors may be arranged only at the time of a preliminary experiment for obtaining the replacement end time Tx.

Further, various chemical substances used in the process of the above embodiment are only some examples. Various other chemical substances can be used instead of these if those chemical substances conform to the technical idea of the invention.

As the specific embodiment has been illustrated and described above, the first step can be performed with the dry substrate accommodated in the chamber and, on the other hand, the second step can be performed with the substrate wet with the liquid to be replaced accommodated in the chamber in the replacement end time determination method according to the invention. According to this configuration, accurate determination is possible by setting the same conditions other than the presence or absence of the liquid to be replaced.

Further, for example, the density of the processing fluid can be detected based on the measurement result of the mass flow meter arranged in the discharge path of the processing fluid from the chamber.

Further, the replacement end time determination method according to the invention can be applied to the substrate processing method according to the invention. That is, for a "predetermined time" in the first aspect of the substrate processing method of the invention, the replacement end time determination method according to the invention can be performed in advance and the predetermined time can be determined based on a result of the determination method. Further, in the second aspect of the substrate processing method of the invention, the value of a chamber internal pressure or a density of a fluid when the replacement is regarded to be finished can be obtained by performing the replacement end time determination method according to the invention in advance, and the end of the replacement can be determined when a detection value during an actual process becomes substantially equal to the obtained value.

Further, in the substrate processing method of the invention, the replacement end time determination method according to the invention is desirably performed prior to the substrate drying process when at least one of the type of the substrate, the amount of the liquid to be replaced constituting the liquid film and the supply/discharge recipe is changed. By doing so, the wastes of the processing time and the fluid consumption can be suppressed in actual substrate processing.

Further, in the substrate processing apparatus and substrate processing method according to the invention, the processing fluid in the chamber may be discharged and the process of drying the substrate may be performed when the end of the replacement is determined. Since the supercritical state needs not be maintained after the end of the replacement, the processing time can be shortened and the consumption of the processing fluid can be reduced by quickly shifting to the drying process after the end of the replacement.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

INDUSTRIAL APPLICABILITY

This invention can be applied to processings in general for replacing a liquid to be replaced using a processing fluid introduced into a chamber. For example, the invention can be suitably applied to a substrate drying processing for drying a substrate such as a semiconductor substrate by a supercritical fluid.

REFERENCE SIGNS LIST 1 substrate processing apparatus
12 processing chamber (chamber)
55 fluid collector (supply/discharge part)
57 fluid supplier (supply/discharge part)
90 control unit (controller)
171, 172 density detector (density detector, mass flow meter)
S substrate
S201-S205 first step
S206-S210, S303 second step
S211, S304-S305 third step
SP processing space

The invention claimed is:

1. A replacement end time determination method in a process of replacing a liquid to be replaced by a processing fluid in a supercritical state in a chamber, the replacement end time determination method comprising:

a first step of obtaining a density profile representing a change of a density of the processing fluid in the chamber with time while maintaining the processing fluid in the chamber in a supercritical state by supplying the processing fluid into and discharging the processing fluid from the chamber in accordance with a predetermined supply/discharge recipe from a state where the liquid to be replaced is not present in the chamber;

a second step of obtaining a density profile while maintaining the processing fluid in the chamber in the supercritical state by supplying the processing fluid into and discharging the processing fluid from the chamber in accordance with the supply/discharge recipe from a state where the liquid to be replaced is present in the chamber; and a third step of determining the replacement end time based on the density profiles obtained in the first step and the second step, wherein the supply/discharge recipe is determined in advance to fill inside of the chamber with the processing fluid in the supercritical state and in the third step:

the density profiles obtained in the first step and the second step are compared; and a time at which the densities obtained in the first step and the second step become substantially equal after the density obtained in the second step becomes larger than the density obtained in the first step is regarded as a time of an end of replacement of the liquid to be replaced by the processing fluid.

2. The replacement end time determination method according to claim 1, wherein the first step is performed with a dry substrate accommodated in the chamber and the second step is performed with a substrate wet with the liquid to be replaced accommodated in the chamber.

3. The replacement end time determination method according to claim 1, wherein the density of the processing fluid is detected based on a measurement result of a mass flow meter arranged in a discharge path of the processing fluid from the chamber.

4. A substrate processing method for drying a substrate by replacing a liquid film of a liquid to be replaced covering a surface of the substrate by a processing fluid in a supercritical state, the substrate processing method comprising:

accommodating the substrate having the liquid film into a chamber;

filling inside of the chamber with the processing fluid in the supercritical state by supplying the processing fluid into and discharging the processing fluid from the chamber based on a predetermined supply/discharge recipe; and drying the substrate by discharging the processing fluid from the chamber after the supercritical state is continued for a predetermined time, wherein the predetermined time is determined based on a result of the replacement end time determination method according to claim 1.

5. A substrate processing method for drying a substrate by replacing a liquid film of a liquid to be replaced covering a surface of the substrate by a processing fluid in a supercritical state, the substrate processing method comprising:

accommodating the substrate having the liquid film into a chamber;

filling inside of the chamber with the processing fluid in the supercritical state by supplying the processing fluid into and discharging the processing fluid from the chamber based on a predetermined supply/discharge recipe;

detecting a density of the processing fluid in the chamber and determining a time of an end of the replacement based on a detection value; and drying the substrate by discharging the processing fluid from the chamber after the end of the replacement is determined, wherein a reference value of an internal pressure or the density in the chamber when the replacement is regarded to end is obtained by performing the replacement end time determination method according to claim 1 in advance; and the end of the replacement is determined when the detection value becomes substantially equal to the reference value.

6. The substrate processing method according to claim 4, wherein the replacement end time determination method is performed prior to the drying process of the substrate when at least one of a type of the substrate, an amount of the liquid to be replaced constituting the liquid film and the supply/discharge recipe is changed.

7. The replacement end time determination method according to claim 2, wherein the density of the processing fluid is detected based on a measurement result of a mass flow meter arranged in a discharge path of the processing fluid from the chamber.

8. The substrate processing method according to claim 5, wherein the replacement end time determination method is performed prior to the drying process of the substrate when at least one of a type of the substrate, an amount of the liquid to be replaced constituting the liquid film and the supply/discharge recipe is changed.

9. A substrate processing method for drying a substrate by replacing a liquid film of a liquid to be replaced covering a surface of the substrate by a processing fluid in a supercritical state, the substrate processing method comprising:

accommodating the substrate having the liquid film into a chamber;

filling inside of the chamber with the processing fluid in the supercritical state by supplying the processing fluid into and discharging the processing fluid from the chamber based on a predetermined supply/discharge recipe; and drying the substrate by discharging the processing fluid from the chamber after the supercritical state is continued for a predetermined time, wherein the predetermined time is determined according to a time at which a density of the processing fluid when the processing fluid in the chamber is maintained in the supercritical state by supplying the processing fluid into and discharging the processing fluid from the chamber in accordance with the supply/discharge recipe from a state where the liquid to be replaced is present in the chamber becomes substantially equal to a density of the processing fluid when the processing fluid in the chamber is maintained in the supercritical state by supplying the processing fluid into and discharging the processing fluid from the chamber in accordance with the supply/discharge recipe from a state where the liquid to be replaced is not present in the chamber after a former density becomes larger than a latter density.

10. A substrate processing method for drying a substrate by replacing a liquid film of a liquid to be replaced covering a surface of the substrate by a processing fluid in a supercritical state, the substrate processing method comprising:

accommodating the substrate having the liquid film into a chamber;

filling inside of the chamber with the processing fluid in the supercritical state by supplying the processing fluid into and discharging the processing fluid from the chamber based on a predetermined supply/discharge recipe;

detecting a density of the processing fluid in the chamber and determining a time of an end of the replacement based on a detection value; and drying the substrate by discharging the processing fluid from the chamber after the end of the replacement is determined, wherein the time of the end of the replacement is determined based on a density change of the processing fluid in the chamber measured in advance while the processing fluid in the chamber is maintained in the supercritical state by supplying the processing fluid into and discharging the processing fluid from the chamber in accordance with the supply/discharge recipe from a state where the liquid to be replaced is not present and the detection value.

11. A substrate processing apparatus for drying a substrate by replacing a liquid film of a liquid to be replaced covering a surface of the substrate by a processing fluid in a supercritical state, the substrate processing apparatus comprising:

a chamber which accommodates the substrate having the liquid film;

a supply/discharge part which supplies the processing fluid into and discharges the processing fluid from the chamber based on a predetermined supply/discharge recipe;

a density detector which detects a density of the processing fluid in the chamber; and a controller which determines a time of an end of the replacement based on a density change of the processing fluid in the chamber detected by the density detector in advance while the processing fluid in the chamber is maintained in the supercritical state by supplying the processing fluid into and discharging the processing fluid from the chamber in accordance with the supply/discharge recipe from a state where the liquid to be replaced is not present in the chamber and a detection value of the density detected by the density detector.

12. The substrate processing apparatus according to claim 11, wherein the density detector includes a mass flow meter arranged in a discharge path of the processing fluid from the chamber and detects the density of the processing fluid based on a measurement result of the mass flow meter.

13. The substrate processing apparatus according to claim 11, wherein the controller makes the substrate dried by causing to discharge the processing fluid in the chamber when the end of the replacement is determined.

14. The substrate processing apparatus according to claim 12, wherein the controller makes the substrate dried by causing to discharge the processing fluid in the chamber when the end of the replacement is determined.

* * * * *